United States Patent
Naito et al.

(10) Patent No.: US 6,239,594 B1
(45) Date of Patent: May 29, 2001

(54) MAGETO-IMPEDANCE EFFECT ELEMENT

(75) Inventors: Yutaka Naito; Yoshito Sasaki; Takashi Hatanai, all of Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/401,624

(22) Filed: Sep. 22, 1999

(30) Foreign Application Priority Data

Sep. 25, 1998 (JP) .................................................. 10-272312

(51) Int. Cl.$^7$ .................................................. G01R 33/02
(52) U.S. Cl. .......................... 324/249; 324/252
(58) Field of Search .................................. 324/244, 252, 324/249; 338/32 R; 360/110, 113

(56) References Cited

U.S. PATENT DOCUMENTS

| 5,764,055 | 6/1998 | Kawase ................................. 324/249 |
| 5,889,403 | 3/1999 | Kawase ................................. 324/249 |
| 6,028,748 | * 2/2000 | Kuroe et al. ......................... 360/110 |

FOREIGN PATENT DOCUMENTS 0 899 798 * 3/1999 (EP) ............................... H01L/43/10

| 7-181239 | 7/1995 | (JP) . |
| 8-184656 | 7/1996 | (JP) . |
| 11-109006 | 4/1999 | (JP) . |

OTHER PUBLICATIONS

Katou Mori et al., "Magneto Impedance (MI) Element", *Reports of Magnetics Study Group,* vol. 1, MAG–94, No. 75–84, pp. 27–36, 1994 (including translation of relevant portions).

* cited by examiner

Primary Examiner—Jay Patidar
Assistant Examiner—Henry S. Andersen
(74) Attorney, Agent, or Firm—Brinks Hofer Gilson & Lione

(57) ABSTRACT

A magnet layer or antiferromagnetic thin film layer composed of a thin film serving as a bias magnetic field applying member is provided at both ends of a magnetic thin film having a magneto-impedance effect so that a bias magnetic field Hbi is applied to the magnetic thin film layer in parallel with the direction of application of an external magnetic field Hex to the magnetic thin film layer. As the magnetic thin film layer, a soft magnetic material having the composition $Co_l Ta_m Hf_n$, $Fe_h R_i O_j$, $(Co_{1-v} T_v)_x M_y O_z X_w$, $T_{100-d-e-f-g} X_d M_e Z_f Q_g$ or $T_{100-p-q-f-g} Si_p Al_q M_e Z_f Q_g$ is used.

6 Claims, 9 Drawing Sheets

MAGETO-IMPEDANCE EFFECT ELEMENT

BACKGROUND OF THE INVENTION

1. Field of the Invention

The present invention relates to a magneto-impedance effect element having a magneto-impedance effect.

2. Description of the Related Art

FIG. 10 is a drawing of a circuit for measuring magneto-impedance characteristics of a conventional magneto-impedance effect element. FIG. 11 is a graph showing the magneto-impedance characteristics of an amorphous wire of $(Fe_6Co_{94})_{72.5}Si_{12.5}B_{15}$ having a conventional magneto-impedance effect. FIG. 12 is a drawing of another circuit for measuring magneto-impedance characteristics of a conventional magneto-impedance effect element.

In recent years, a magnetic field sensor element having a smaller size, higher sensitivity and higher responsiveness (high-frequency operation) than a conventional flux sensing type has been demanded, and an element (magneto-impedance effect element) having the magneto-impedance effect has attracted attention with rapid development of information apparatus, measurement apparatus, control apparatus, etc.

The magneto-impedance effect means that with a small high-frequency current passed through a magnetic material having soft magnetic properties and formed in a wire, a ribbon, or the like, the application of an external magnetic field causes a sensitive change in impedance of the magnetic material. Such a magneto-impedance effect is known to be based on "the skin effect" that when an alternating current is passed through a magnetic material, the alternating current tends to flow near the skin of the magnetic material.

More specifically, the magneto-impedance effect means that for example, in the closed circuit shown in FIG. 10, when an external magnetic field Hex is applied to a wire-shaped magneto-impedance effect element Mi in the length direction thereof with an alternating current Iac in the MHz frequency band supplied to the magneto-impedance effect element Mi from an alternating current source Eac, an output voltage Emi due to the impedance inherent to the material is produced between both ends of the magneto-impedance effect element Mi even with the weak external magnetic field Hex of several Oe or less, and the amplitude changes in the range of several tens % corresponding to the strength of the external magnetic field Hex, i.e., an impedance change occurs.

An element (magneto-impedance effect element) having such a magneto-impedance effect is sensitive to the external magnetic field Hex in the length direction of the element. Therefore, for example, in use as a magnetic field sensor, unlike a conventional flux sensing type magnetic field sensor element comprising a coiled core, the magnetic field detection angle does not deteriorate even if the length of the sensor head is decreased to about 1 mm or less, thereby obtaining a weak magnetic field sensor having high resolution of about $10^{-5}$ Oe. In addition, since excitation of several MHz is possible, a high-frequency magnetic field of several hundreds MHz can be used as a carrier for amplitude modulation, and thus the cut-off frequency of the magnetic field sensor can easily be set to 10 MHz or more. Therefore, application to a new micro-magnetic head, a weak magnetic field sensor, and the like is expected.

As soft magnetic materials having the magneto-impedance effect, Fe—Co—Si—B system materials, for example, an amorphous wire of $(Fe_6Co_{94})_{72.5}Si_{12.5}B_{15}$ (Katuo Mori, et al, "Magneto-Impedance (MI) Element" Japanese Electro-technical Committee, Reports of Magnetics study group, Vol. 1, MAG-94, No. 75–84, p27–36, 1994), etc. have been reported. As the Fe—Co—Si—B system amorphous wire, wires having diameters of 5 to 124 µm are obtained. Also the Fe—Co—Si—B system materials exhibit magneto-impedance characteristics in which the output voltage Emi (mV) shows substantially symmetry in the negative and positive applied external magnetic fields Hex (Oe) with the external magnetic field Hex=0 (Oe) as a center, as shown by solid lines in FIG. 11. FIG. 11 also indicates that sensitivity rapidly increases in the range of weak applied external magnetic fields Hex of about −2 Oe to +2 Oe, causing difficulties in obtaining quantitativity in this range. Thus, the amorphous wire is unpractical as a magneto-impedance effect element for detecting weak magnetic fields.

Furthermore, since the output voltage gently changes in the magnetic field range of absolute values of over 2 Oe, quantitativity can easily be obtained, causing practicability. However, in order to actually use a magneto-impedance effect element, it is necessary to transversely (in the axial direction of the external magnetic field Hex) shift the curve of magneto-impedance characteristics by applying a bias magnetic field Hbi of several Oe to make it easy to obtain output near the external magnetic field Hex=0 (Oe). For example, a linear portion must be placed on the axis at the external magnetic field Hex=0 (Oe), as shown by a dotted line in FIG. 11.

Conventionally as shown in FIG. 12, the magneto-impedance effect element Mi has a wire shape (or a ribbon shape), and thus a coil C is wound in an appropriate number of turns around the element Mi so that a direct current Idc is passed through the coil C to produce a bias magnetic field Hbi, to apply the magnetic field Hbi to the magneto-impedance effect element Mi in the length direction thereof.

However, the process for winding the coil C on the small wire-shaped (or ribbon-shaped) magneto-impedance effect element Mi is complicated to increase production cost, and winding the coil C on the magneto-impedance effect element Mi causes an increase in size, thereby inhibiting miniaturization in application to a magnetic head, a magneto-impedance effect element sensor such as a weak magnetic field sensor, or the like. Furthermore, since the direct current Idc is passed through the coil C to produce the bias magnetic field Hbi, electric power from a direct current source Edc is required, thereby inhibiting electric power saving of the magneto-impedance effect element sensor.

SUMMARY OF THE INVENTION

Accordingly, it is an object of the present invention to provide a magneto-impedance effect element which permits miniaturization and power savings.

In a first embodiment for achieving the object of the present invention, a magneto-impedance effect element of the present invention comprises a magnetic thin film layer having the magneto-impedance effect, and a bias magnetic field applying means comprising a thin film for applying a bias magnetic field to the magnetic thin film layer in parallel with the direction of application of the external magnetic field applied thereto.

In a second embodiment, a magneto-impedance effect element of the present invention comprises the bias magnetic field applying means comprising magnet layers provided in contact with both ends of the magnetic thin film layer.

In a third embodiment, a magneto-impedance effect element of the present invention comprises the bias magnetic field applying means comprising a hard magnetic thin film layer or a antiferromagnetic thin film layer laminated on the magnetic thin film layer.

In a fourth embodiment, a magneto-impedance effect element of the present invention comprises the magnetic thin film layer to which the external magnetic field is applied in the direction of the hard magnetization axis.

In a fifth embodiment, a magneto-impedance effect element of the present invention comprises the magnetic thin film layer which is annealed or deposited in a magnetic field.

In a sixth embodiment, a magneto-impedance effect element of the present invention comprises the magnetic thin film layer comprising a soft magnetic thin film mainly composed of an amorphous phase, and represented by the composition formula $Co_lTa_mHf_n$ wherein l, m and n by satisfy the relations $70 \leq l \leq 90$, $5 \leq m \leq 21$, $6.6 \leq n \leq 15$, and $1 \leq m/n \leq 2.5$.

In a seventh embodiment, a magneto-impedance effect element of the present invention comprises the magnetic thin film layer comprising a soft magnetic thin film composed of an amorphous phase at a ratio of 50% or more of the whole structure, and the balance composed of bcc-structure Fe crystal grains having an average grain size of 30 nm or less, and represented by the composition formula $Fe_hR_iO_j$ wherein R is at least one element selected from the rare earth elements, and the group consisting of Ti, Zr, Hf, V, Nb, Ta, and W, and h, i and j by at % satisfy the relations $45 \leq h \leq 70$, $5 \leq i \leq 30$, $10 \leq j \leq 40$, and $h+i+j=100$. When element R in the above composition is at least one element selected from the rare earth elements, h and j by at % preferably satisfy the relations $50 \leq h \leq 70$ and $10 \leq j \leq 30$, respectively.

In an eighth embodiment, a magneto-impedance effect element of the present invention comprises the magnetic thin film layer comprising a soft magnetic thin film which is composed of an amorphous phase containing a large amount of oxide of element M, and crystal grains having at least one of bcc, bcp and fcc structures mainly composed of Co and element T, and which is represented by the composition formula $(Co_{l-v}T_v)_xM_yO_zX_w$ wherein T includes at least one of the elements Fe and Ni, M is at least one element selected from the group consisting of Ti, Zr, Hf, Ta, Cr, Mo, Si, P, C, W, B, Al, Ga, Ge and the rare earth elements, X is at least one element selected from the group consisting of Au, Ag, Cu, Ru, Rh, Os, Ir, Pt, and Pd, the composition ratio v satisfies the relation $0 \leq v \leq 0.7$, and x, y, z and w by at % satisfy the relations $3 \leq y \leq 30$, $7 \leq z \leq 40$, $0 \leq w \leq 20$, and $20 \leq y+z+w \leq 60$, the balance composed of x. The soft magnetic thin film preferably comprises 50% or more of amorphous phase containing a large amount of oxide of element M on the basis of the whole structure.

In a ninth embodiment, a magneto-impedance effect element of the present invention comprises the magnetic thin film layer comprising a soft magnetic thin film mainly composed of an amorphous phase, and represented by the composition formula $Co_aZr_bNb_c$ wherein a, b and c by at % satisfy the relations $78 \leq a \leq 91$, $b=(0.5~0.8) \times (100-a)$, and $c=100-a-b$.

In a tenth embodiment, a magneto-impedance effect element of the present invention comprises the magnetic thin film layer comprising a soft magnetic thin film composed of crystal grains of at least one of bcc structure Fe, bcc structure FeCo and fcc structure Co having an average grain size of 30 nm or less, or a mixture thereof at a ratio of 50% or more of the whole structure, and represented by the composition formula $T_{100-d-e-f-g}X_dM_eZ_fQ_g$ wherein T is at least one of the elements Fe and Co, X is at least one of the elements Si and Al, M is at least one element selected from the group consisting of Ti, Zr, Hf, V, Nb, Ta, Mo and W, Z is at least one of the elements C and N, Q is at least one element selected from the group consisting of Cr, Re, Ru, Rh, Ni, Pd, Pt, and Au, and d, e, f and g by at % satisfy the relations $0 \leq d \leq 25$, $1 \leq e \leq 10$, $0.5 \leq f \leq 15$, and $0 \leq g \leq 10$. The balance of the structure is mainly composed of an amorphous phase.

In an eleventh embodiment, a magneto-impedance effect element of the present invention comprises the magnetic thin film layer comprising a soft magnetic thin film composed of crystal grains of at least one of bcc structure Fe, bcc structure FeCo and fcc structure Co having an average grain size of 30 nm or less, or a mixture thereof at a ratio of 50% or more of the whole structure, and represented by the composition formula $T_{100-p-q-f-g}Si_pAl_qM_eZ_fQ_g$ wherein T is at least one of the elements Fe and Co, M is at least one element selected from the group consisting of Ti, Zr, Hf, V, Nb, Ta, Mo and W, Z is at least one of the elements C and N, Q is at least one element selected from the group consisting of Cr, Re, Ru, Rh, Ni, Pd, Pt, and Au, and p, q, e, f and g by at % satisfy the relations $8 \leq p \leq 15$, $0 \leq q \leq 10$, $1 \leq e \leq 10$, $0.5 \leq f \leq 15$, and $0 \leq g \leq 10$, respectively. The balance of the structure is mainly composed of an amorphous phase.

DESCRIPTION OF THE PREFERRED EMBODIMENT

Figure 1A:
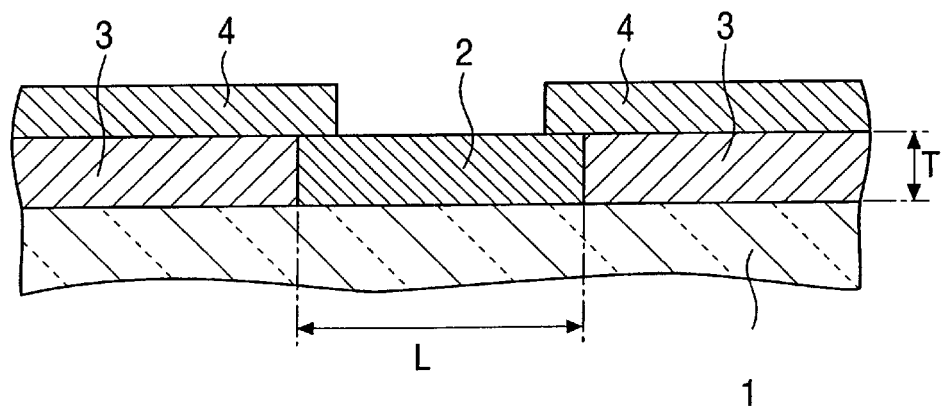
FIGS. 1A–1C are drawing illustrating a magneto-impedance effect element in accordance with a first embodiment of the present invention.
Figure 1B:
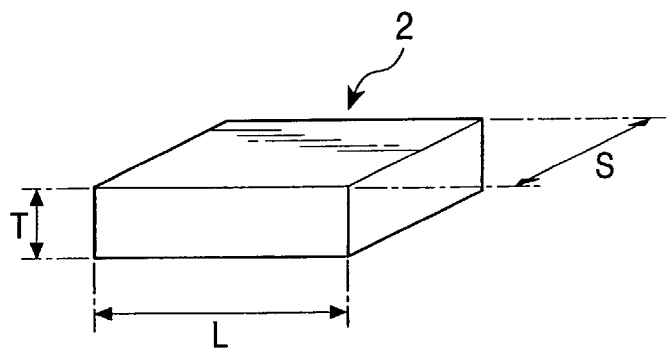
Figure 1C:
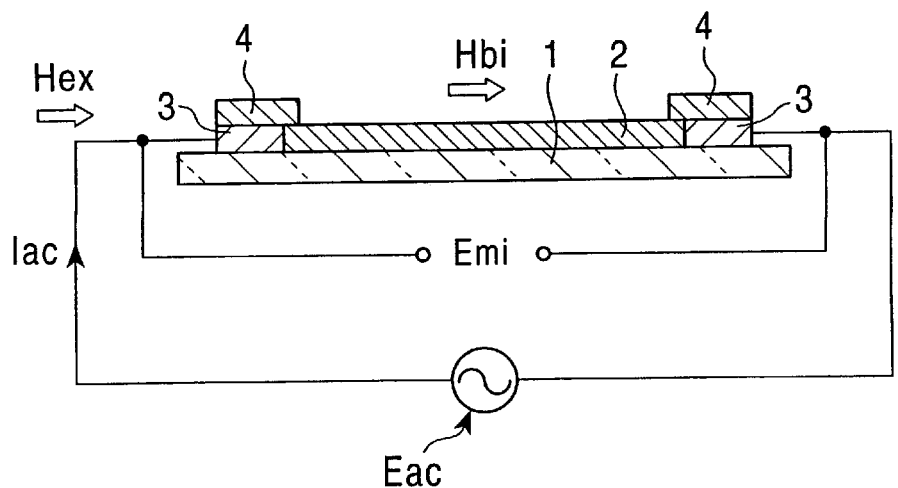

A magneto-impedance effect element in accordance with a first embodiment of the present invention will be described below. FIG. 1 is a drawing illustrating a magneto-impedance effect element in accordance with a first embodiment of the present invention, in which FIG. 1A is a sectional view of a principal portion of the magneto-impedance effect element, FIG. 1B is a perspective view of a magnetic thin film layer, and FIG. 1C is a drawing illustrating the circuit of the magneto-impedance effect element of the present invention.

The inventors found that a layered structure comprising a thin film of a magnetic material having the magneto-impedance effect, and a thin film as means for applying a bias magnetic field permits realization of miniaturization of a magneto-impedance effect element, and that the use of a specified magnetic material for the magnetic thin film layer permits achievement of a magneto-impedance effect element having proper sensitivity with only a small bias magnetic field. As shown in FIG. 1, the magneto-impedance effect element of this embodiment comprises a substrate 1 made of glass or the like, and a magnetic thin film layer 2 provided on the substrate 1 by sputtering or the like, and made of a ferromagnetic material having the magneto-impedance effect and exhibiting soft magnetism at room temperature. As shown in FIG. 1B, the magnetic thin film 2 has a length L of 2 to 8 mm, a width S of 0.5 to 1 mm, and a thickness T of 2 $\mu$m. In this figure, particularly the thickness (vertical) direction is exaggerated.

Two electrode layers 3 made of Cr or the like are provided at both ends of the magnetic thin film layer 2 so that the thickness is substantially the same as the thickness T (2 $\mu$m) of the magnetic thin film 2, and is connected to an AC power source (not shown). Two magnet layers 4 provided in the form of a thin film by sputtering, and made of a ferromagnetic material exhibiting hard magnetic properties, such as a Co—Pt alloy or the like, are laminated on the magnetic thin film layer and the electrode layers 3 so as to contact the magnetic thin film layer 2.

In an operation of the magneto-impedance effect element constructed as described above, an alternating current Iac is supplied to the magnetic thin film layer 2 from the AC power source Eac through the electrode layers 3. When an external magnetic field Hex to be detected is applied to the magnetic thin film 2 in the length direction thereof, an output voltage Emi due to impedance inherent to the material is produced between both ends of the magnetic thin film 2, and the amplitude changes corresponding to the strength of the external magnetic field Hex. At this time, the magnet layers 4 serve as means for applying a bias magnetic field so that a bias magnetic field Hbi is applied, by utilizing a leakage magnetic field, to the magnetic thin film layer 2 in the length direction, i.e., in the direction parallel to the application direction of the external magnetic field Hex, shifting the output of the magneto-impedance properties to easily obtain it with the external magnetic field Hex near zero (Oe). Therefore, in actual use as a magneto-impedance effect element, quantitative reliability can be improved.

Since the magnet layers 4 made of a ferromagnetic material having high magnetic properties are formed as the bias magnetic field applying means, as described above, it is unnecessary to pass a current through the bias magnetic field applying means for producing the bias magnetic field Hbi, thereby achieving power saving of the magneto-impedance effect element. Since the magnet layers 4 are formed in the form of a thin film by sputtering or the like using a Co—Pt alloy, the magneto-impedance effect element can be miniaturized.

Figure 2:
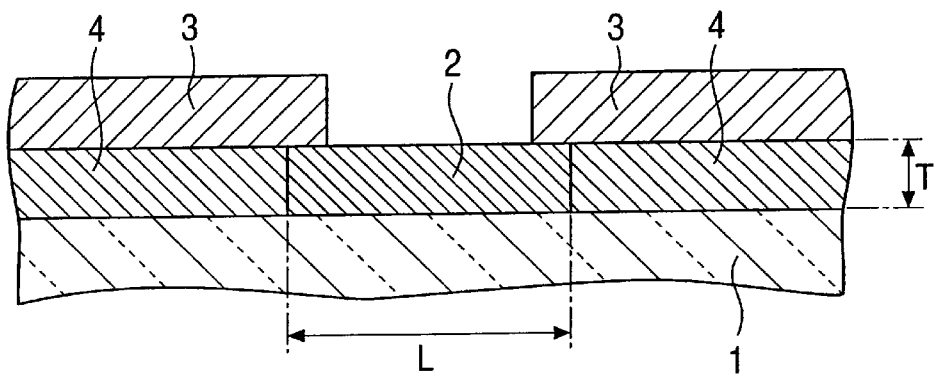
FIG. 2 is a sectional view illustrating a principal portion of a magneto-impedance effect element in accordance with a second embodiment of the present invention.

Next, a magneto-impedance effect element in accordance with a second embodiment of the present invention will be described. FIG. 2 is a sectional view illustrating a principal portion of the magneto-impedance effect element in accordance with the second embodiment of the present invention. The magneto-impedance effect element of this embodiment has a structure different from the first embodiment, in which the two magnet layers 4 as means for applying a bias magnetic field to the magnetic thin film 2 are provided in the form of a thin film on the substrate 1 by sputtering or the like to contact the both ends of the magnetic thin film layer 2 so that the thickness is substantially the same as the thickness T of the magnetic thin film layer 2. The two electrode layers 3 are laminated on the magnetic thin film layer 2 and the magnet layers 4 to contact the magnetic thin film layer 2. Like in the first embodiment, this arrangement enables the bias magnetic field Hbi to be applied to the magnetic thin film layer 2 by the magnet layers 4 in the length direction so as to shift the magneto-impedance properties.

Figure 3:
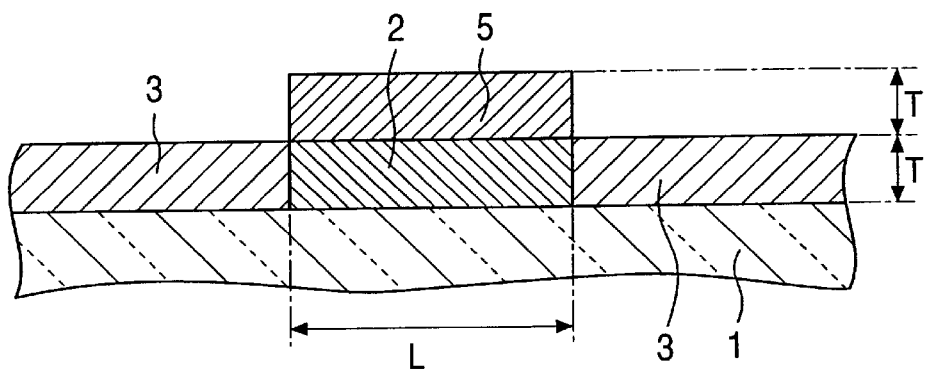
FIG. 3 is a sectional view illustrating a principal portion of a magneto-impedance effect element in accordance with a third embodiment of the present invention.

Next, a magneto-impedance effect element in accordance with a third embodiment of the present invention will be described. FIG. 3 is a sectional view illustrating a principal portion of the magneto-impedance effect element in accordance with the third embodiment of the present invention. This embodiment comprises a thin film of an antiferromagnetic material serving as means for applying a bias magnetic field so that a bias magnetic field Hbi is applied by utilizing an exchange anisotropic magnetic field provided in the contact interface between the thin film and the magnetic thin film layer 2 made of a ferromagnetic material having soft magnetic properties, and having the magneto-impedance effect.

As shown in FIG. 3, the magnetic thin film layer 2 made of a ferromagnetic material having the magneto-impedance effect and exhibiting soft magnetism at room temperature is provided on the substrate 1 made of glass or the like by sputtering, vapor deposition, or the like. Like in the first embodiment shown in FIG. 1B, the shape of the soft magnetic thin film has a length L of 2 to 8 mm, a width S of 0.5 to 1 mm, and a thickness T of 2 $\mu$m.

An antiferromagnetic thin film layer 5 made of a Fe—Mb alloy, a Ni—Mb alloy, a Pt—Mb alloy, NiO, or the like is laminated directly on the magnetic thin film layer 2 to have the same shape as the magnetic thin film layer 2, in which the length L is 2 to 8 mm, the width S is 0.5 to 1 mm, and the thickness T is 5 $\mu$m. This also enables the bias magnetic field Hbi to be applied to the magnetic thin film layer 2 by the antiferromagnetic thin film layer 5 in the length direction to shift the obtained magneto-impedance properties.

In the magnetic thin film layer 2 having the magneto-impedance effect described in each of the above first to third embodiments, the length direction, i.e., the application direction of the external magnetic field Hex, preferably coincides with the direction of hard magnetization axis. With the external magnetic field Hex applied in the direction of hard magnetization axis, magnetic permeability is increased in this direction to increase sensitivity to the applied external magnetic field Hex. The magnetic thin film layer 2 in which the hard magnetization axis coincides with the application direction of the external magnetic field Hex can easily be deposited by sputtering or the like in a magnetic field, or annealing in a magnetic field in a high-temperature atmosphere after deposition with no (small) magnetic field.

EXAMPLES

Example 1

Figure 4:
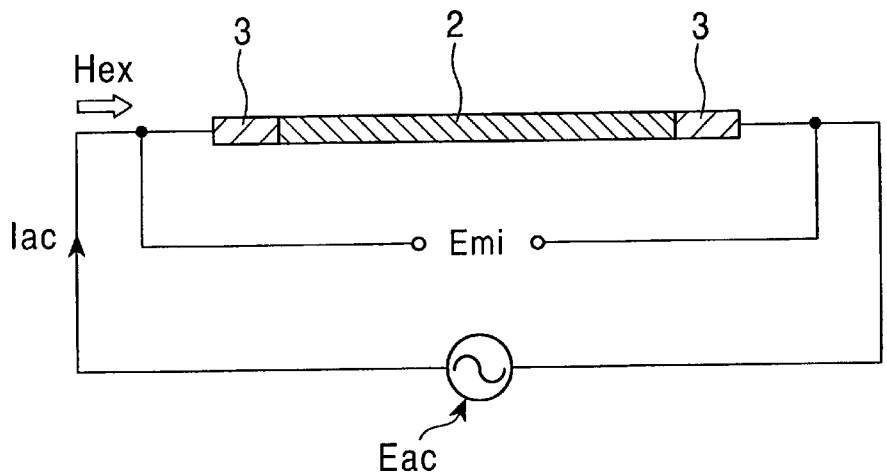
FIG. 4 is a drawing illustrating a circuit for measuring magneto-impedance characteristics of a magnetic thin film layer used in a magneto-impedance effect element of the present invention.
Figure 5:
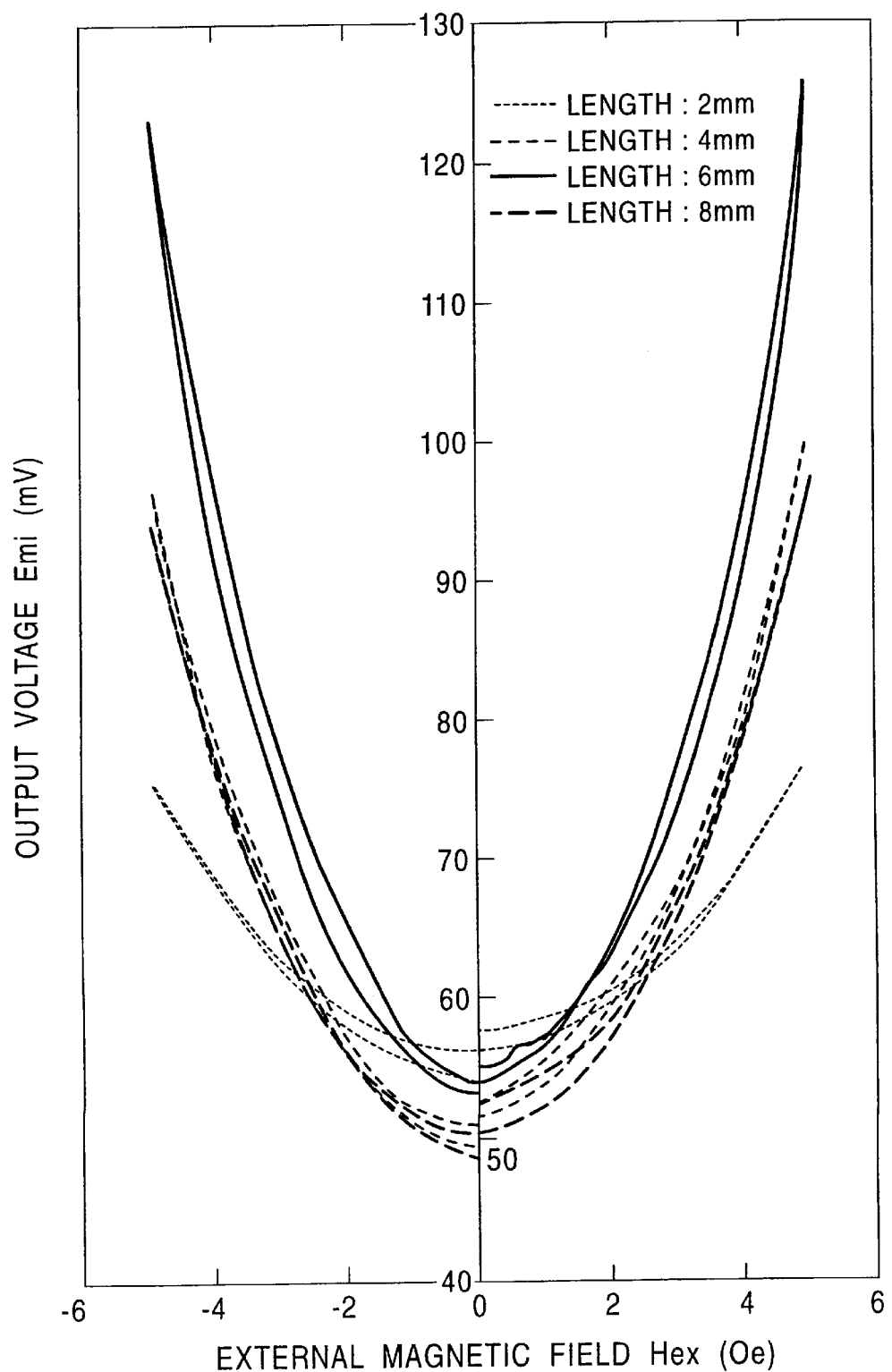
FIG. 5 is a graph showing magneto-impedance characteristics of a $Co_lTa_mHf_n$ system magnetic thin film layer used in a magneto-impedance effect element of the present invention.
Figure 6:
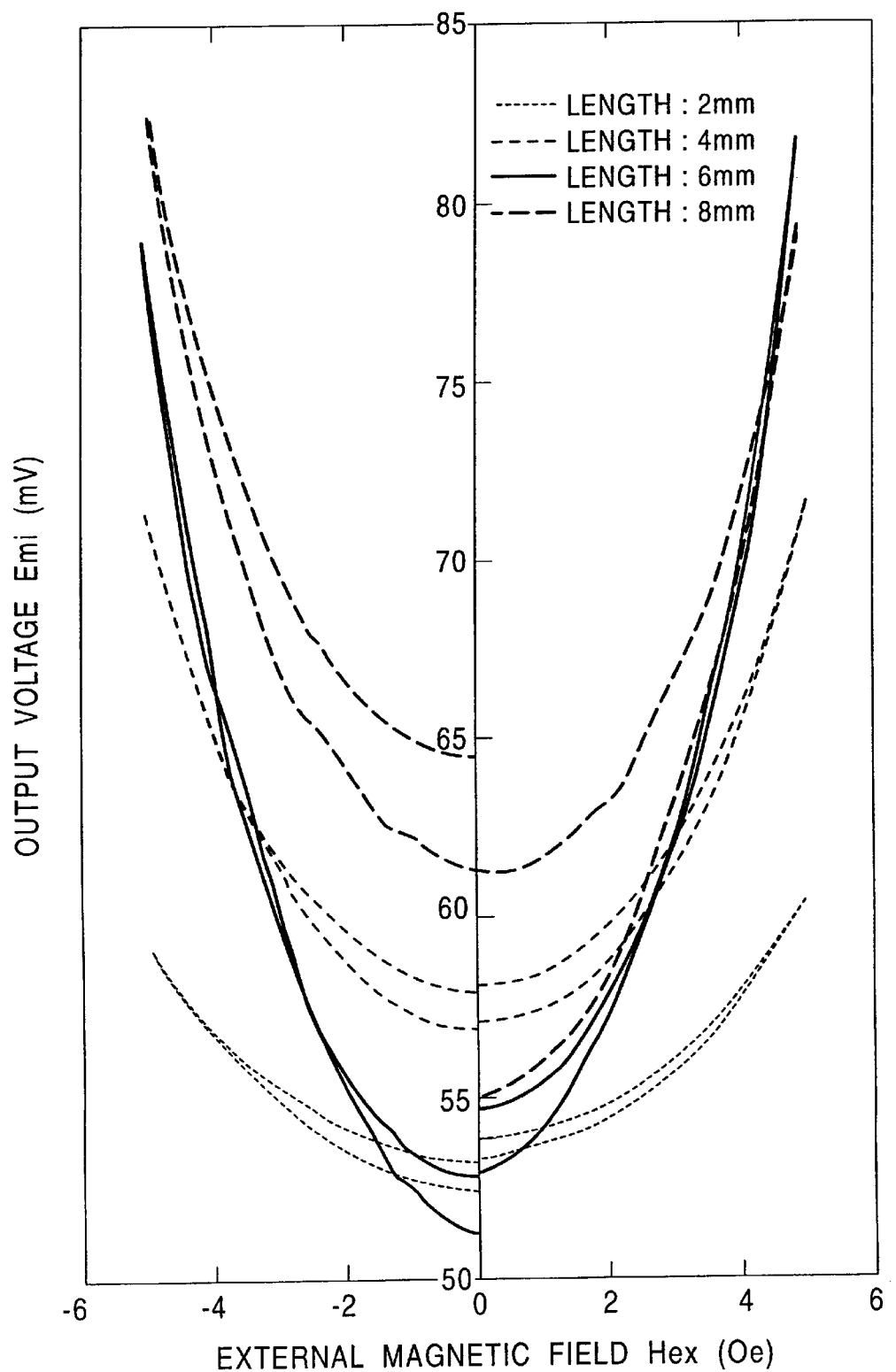
FIG. 6 is a graph showing magneto-impedance characteristics of a $Co_lTa_mHf_n$ system magnetic thin film layer used inca a magneto-impedance effect element of the present invention.

Magnetic materials having the magneto-impedance effect, which can be used for the magneto-impedance effect element of the present invention, will be described below with reference to examples. FIG. 4 is a drawing of a circuit for measuring magneto-impedance properties of a magnetic thin film layer used in the magneto-impedance effect element of the present invention. FIGS. 5 and 6 are graphs showing magneto-impedance properties of $Co_l Ta_m Hf_n$ system amorphous magnetic thin film layers used in the magneto-impedance effect element of the present invention. FIG. 5 shows magnetic thin film layers having a width S of 0.5 mm, and FIG. 6 shows magnetic thin film layers having a width S of 1 mm.

Materials used for forming the magnetic thin film layer 2 of the magneto-impedance effect element of the present invention include materials represented by the composition formula $Co_l Ta_m Hf_n$ wherein the composition ratios l, m and n by at % satisfy the relations $70 \leq l \leq 90$, $5 \leq m \leq 21$, $6.6 \leq n \leq 15$, and $1 \leq m/n \leq 2.5$, having a structure mainly composed of an amorphous phase, and exhibiting soft magnetic properties.

The magnetic thin film layer 2 of the magneto-impedance effect element of the present invention must be made of a ferromagnetic material having soft magnetic properties. This is because materials (soft magnetic materials) having soft magnetic properties have the magneto-impedance effect. The magnetic thin film layer 2 made of a soft magnetic material is also required to have the following properties. The magnetic permeability $\mu$ must be high in the high-frequency region of several tens MHz to several GHz (however, the frequency band in which high permeability $\mu$ is required varies with application of the magneto-impedance effect element). In relation to this, in order that magnetic permeability $\mu$ is high in the high-frequency region, resistivity $\rho$ must be high. In order to prevent magnetic properties from deteriorating due to the stress applied to the soft magnetic material by the external magnetic field Hex, the magnetostriction constant $\lambda$ is preferably low.

First, the $Co_l Ta_m Hf_n$ system magnetic thin film layer 2 was formed, and the saturation flux density Bs, resistivity $\rho$ and magnetostriction constant $\lambda$ were determined. The magnetic thin film layer 2 was deposited on the substrate 1 made of glass by sputtering using a high-frequency sputtering apparatus comprising a $Co_l Ta_m Hf_n$ system alloy target having a diameter of 4 inches with an input power of 200 W under an Ar gas pressure of $5 \times 10^{-3}$ Torr. The magnetic thin film layer 2 was also formed in a rectangular shape having a length L of 2, 4, 6 or 8 mm, and a width S of 0.5 or 1 mm with the sputtering time controlled so that the thickness T was about 2 $\mu$m. Next, the substrate 1 on which the magnetic thin film layer 2 was deposited was placed in a vacuum heating furnace, maintained in a magnetic field at 500° C. for 60 minutes, and then annealed by slow cooling so that the length direction of the magnetic thin film layer 2 coincided with the direction of the hard magnetization axis.

In the $Co_l Ta_m Hf_n$ system magnetic thin film layer 2, the saturation magnetic flux density Bs depended upon the Co content, and at least a Co content of 70 at % or more was required for obtaining a saturation magnetic flux density Bs of 0.5 T or more. Since the resistivity $\rho$ was low at a Co content of 90 at % or more, the Co content was 90 at % or less.

Ta and Hf are elements for obtaining soft magnetic properties. By adding Ta and Hf in a composition range in which the Ta content is 5 at % to 21 at %, and the Hf content is 6 at % to 15 at %, a soft magnetic material having a high saturation magnetic flux density Bs and high resistivity $\rho$ could be obtained. It was also found that Hf is also an element for removing a negative magnetostriction constant $\lambda$ produced in a Co-Ta system, and the magnetostriction constant $\lambda$ depends upon the ratio represented by (Ta content)/(Hf content). By adding Ta and Hf in the composition range in which the ratio was 1 to 2.5, the magnetostriction constant $\lambda$ could be sufficiently resolved.

Next, the magneto-impedance properties of the $Co_l Ta_m Hf_n$ system magnetic thin film layer 2 were measured. As shown in FIG. 4, two electrode layers 3 made of Cr or the like were provided at both ends of the magnetic thin film layer 2 so that the thickness was substantially the same as the thickness T of the magnetic thin film layer 2, and connected to an AC power source Eac. With the alternating current Iac of 3 MHz supplied, an external magnetic field Hex was applied to the magnetic thin film layer 2 in the length direction thereof to measure the magneto-impedance properties.

FIG. 5 shows the magneto-impedance properties of the magnetic thin film layer 2 comprising $Co_{83} Ta_6 Hf_{11}$ and formed in a width S of 0.5 mm. As shown in FIG. 5, the output voltage Emi, i.e., impedance, changes (increases) substantially symmetrically in the positive and negative directions with the external magnetic field Hex=0 (Oe) as the center, depending upon the absolute value of positive and negative magnetic fields. Namely, the magnetic thin film layer 2 comprising a thin film is found to have the magneto-impedance effect. The magneto-impedance properties are changed by changing the length L of the magnetic thin film layer 2 to 2, 4, 6 and 8 mm. It is thus found that the magnetic thin film layer 2 can be provided in correspondence with magneto-impedance effect elements having various sizes. The magnetic thin film layer 2 can also be applied to various magneto-impedance effects having various sensitivities and applications by changing the length L thereof.

FIG. 6 shows the magneto-impedance properties of the magnetic thin film layer 2 comprising $Co_{83} Ta_6 Hf_{11}$ and formed in a width S of 1.0 mm. Like in FIG. 5, the magneto-impedance properties are changed by changing the length L to 2, 3, 6 and 8 mm. It is also found that even with the same length L, the rising of the magneto-impedance properties become gradual by doubling the thickness T, as compared with FIG. 5. In this way, the magneto-impedance properties can also be changed by changing the thickness T, permitting application to various magneto-impedance effect elements having different sizes, sensitivities and applications.

As shown in FIGS. 5 and 6, since the output voltage Emi gradually changes with changes in impedance regardless of the polarity of the external magnetic field Hex, quantitativity can easily be obtained in the portion showing a gradual change. It is also possible to shift the curve of the magneto-impedance properties transversely (in the axial direction of the external magnetic field Hex) by applying the bias magnetic field Hbi of several Oe using the bias magnetic field applying means described in the above first to third embodiments, thereby making it easy to obtain output with the external magnetic field Hex near Hex=0 (Oe). It is also found to be sufficient that a bias magnetic field Hbi of as low as about 2 Oe is applied. It is thus found that as the bias magnetic field applying means for the magnetic thin film layer 2, an antiferromagnetic material such as a Fe—Mb alloy, a Ni—Mb alloy, a Pt—Mb alloy, A Ir—Mb alloy, a Pd—Mb alloy, or the like, a hard magnetic material such as a Co—Pt alloy or the like can be used to obtain a magneto-impedance effect element which permits miniaturization and easy manufacture, Example 2

Figure 7:
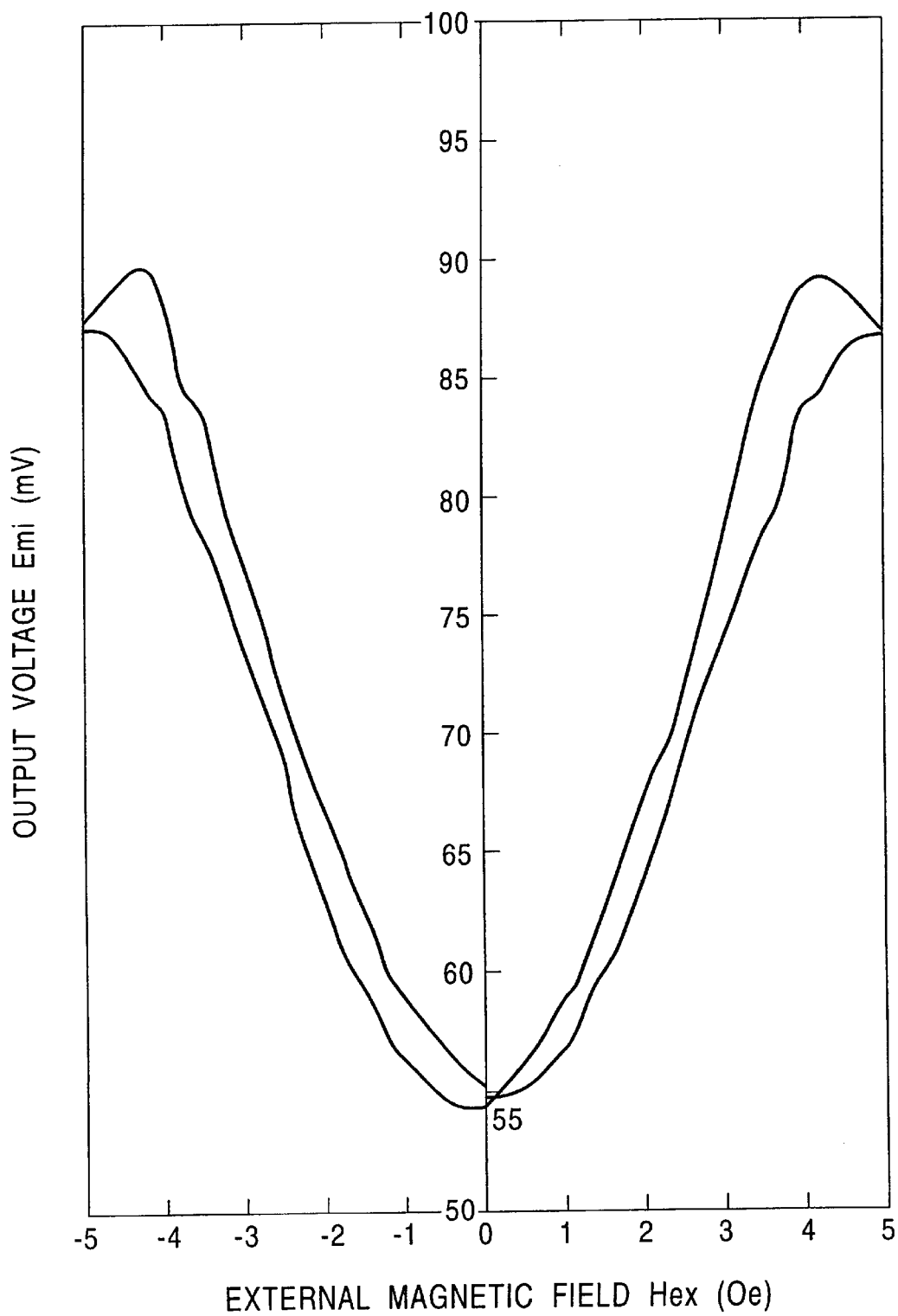
FIG. 7 is a graph showing magneto-impedance characteristics of a $Fe_hR_iO_3$ system magnetic thin film layer used in a magneto-impedance effect element of the present invention.

FIG. 7 is a graph showing the magneto-impedance properties of a $Fe_h R_i O_j$ system magnetic thin film layer used in the magneto-impedance effect element of the present invention. As the magnetic thin film layer 2 having the magneto-impedance effect, another material exhibiting soft magnetic properties can also be used, which is represented by the composition formula $Fe_h R_i O_j$ wherein R is at least one element selected from the rare earth elements and the group consisting of Ti, Zr, Hf, V, Nb, T and W, and h, i and j satisfy the relations $45 \leq h \leq 70$, $5 \leq i \leq 30$, $10 \leq j \leq 40$, and h+i+j=100. The soft magnetic thin film preferably comprises a mixture of an amorphous phase at a ratio of 50% or more of the whole texture, which contains a large amount of an oxide of element M, and the balance composed of a fine-crystal phase mainly comprised of bcc structure Fe having an average crystal grain size of 30 nm or less.

First, the $Fe_h R_i O_j$ system magnetic thin film layer 2 was formed, and the saturation flux density Bs, resistivity ρ and magnetic permeability μ (10 MHz) were determined. The magnetic thin film layer 2 was deposited on the substrate 1 made of glass, which was indirectly cooled with water, by sputtering using a RF magnetron sputtering apparatus with an input power of 400 W and a composite target comprising a Fe target and pellets of each element arranged on the Fe target under an Ar+O$_2$ gas pressure of $5 \times 10^{-3}$ Torr in an atmosphere containing Ar and 0.1 to 2.0% of O$_2$. The magnetic thin film layer 2 was also formed in a rectangular shape having a length L of 4 mm, and a width S of 1 mm with the sputtering time controlled so that the thickness T was about 2 μm. Next, the substrate 1 on which the magnetic thin film layer 2 was deposited was placed in a vacuum heating furnace, maintained in a magnetic field at 400° C. for 120 minutes, and then annealed by slow cooling so that the length direction of the magnetic thin film layer 2 coincided with the direction of the hard magnetization axis. The measurement results are partially shown in Table 1.

TABLE 1

| Film composition | Bs (T) | ρ (μΩ · cm) | μ (1 MHz) |
|---|---|---|---|
| $Fe_{54.9}Hf_{11.0}O_{34.1}$ | 1.2 | 803 | 2199 |
| $Fe_{51.5}Hf_{12.2}O_{36.3}$ | 1.1 | 1100 | 1130 |
| $Fe_{50.2}Hf_{13.7}O_{35.6}$ | 1.0 | 1767 | 147 |
| $Fe_{69.8}Zr_{6.5}O_{23.7}$ | 1.5 | 400 | 2050 |
| $Fe_{65.3}Zr_{8.9}O_{25.8}$ | 1.3 | 460 | 1030 |
| $Fe_{64.4}Nb_{12.2}O_{23.4}$ | 1.3 | 420 | 1600 |
| $Fe_{59.4}Ta_{15.3}O_{25.3}$ | 1.1 | 880 | 580 |
| $Fe_{51.5}Ti_{17.5}O_{31.0}$ | 1.1 | 750 | 420 |
| $Fe_{55.8}V_{13.2}O_{31.0}$ | 1.2 | 560 | 550 |
| $Fe_{58.7}W_{15.8}O_{25.5}$ | 1.2 | 670 | 400 |
| $Fe_{61.6}Y_{5.3}O_{33.1}$ | 1.4 | 420 | 780 |
| $Fe_{63.2}Ce_{7.8}O_{29.0}$ | 1.1 | 580 | 640 |
| $Fe_{69.8}Sm_{11.0}O_{19.2}$ | 1.3 | 500 | 400 |
| $Fe_{68.8}Ho_{11.5}O_{20.0}$ | 1.1 | 800 | 500 |
| $Fe_{64.2}Gd_{11.5}O_{24.3}$ | 1.2 | 840 | 350 |
| $Fe_{61.8}Tb_{10.8}O_{27.4}$ | 1.1 | 750 | 450 |

TABLE 1-continued

| Film composition | Bs (T) | ρ (μΩ · cm) | μ (1 MHz) |
|---|---|---|---|
| $Fe_{62.4}Dy_{9.5}O_{28.0}$ | 1.1 | 680 | 530 |
| $Fe_{59.8}Er_{13.5}O_{26.7}$ | 1.0 | 580 | 380 |

Table 1 indicates that in the above composition range, the $Fe_h R_i O_j$ system magnetic thin film layer 2 has a saturation magnetic flux density Bs of as high as 1.0 T or more, and a resistivity ρ of as high as about 400 to 1000 (μΩ·cm). As shown in Table 1, magnetic permeability μ at 10 MHz is also as high as several hundreds. It is thus found that the magnetic permeability μ is high in the high-frequency region because of the high resistivity ρ. It is also found that the soft magnetic properties deteriorate beyond the above composition range. Therefore, the $Fe_h R_i O_j$ system magnetic thin film layer 2 is found to be an excellent balanced soft magnetic material Next, the magneto-impedance properties of the $Fe_h R_i O_j$ system magnetic thin film layer 2 were measured. The magneto-impedance properties were measured by the same method as Example 1 (FIG. 4). FIG. 7 shows the magneto-impedance properties of a magnetic thin film layer 2 comprising $Fe_{55}Hf_{11}O_{34}$ as an example. FIG. 7 indicates that the magnetic thin film layer 2 comprising $Fe_{55}Hf_{11}O_{34}$ has the magneto-impedance effect. The output voltage changes with excellent linearity regardless of the polarity of the external magnetic field Hex, and the output can easily be obtained with the external magnetic field near Hex=0 (Oe) by applying a low bias magnetic field Hbi of about 2 Oe. Means for applying such a bias magnetic field Hbi can be realized by providing the magnet layers at both ends of the magnetic thin film layer 2, or providing the antiferromagnetic thin film layer 5 on the magnetic thin film layer 2, as described in the first to third embodiments.

Example 3

Figure 8:
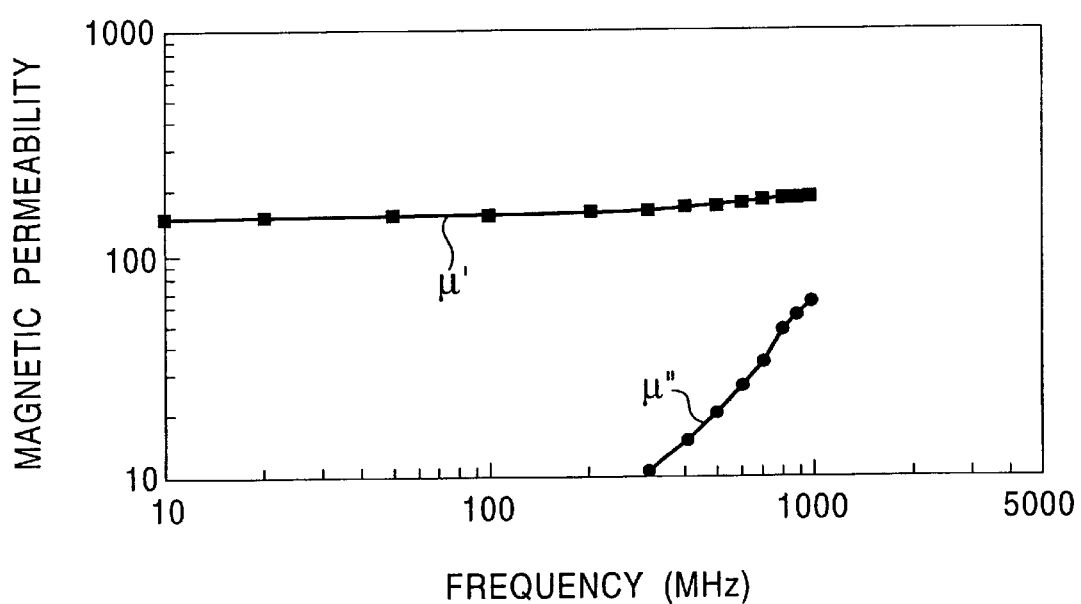
FIG. 8 is a graph showing the relation between frequency and magnetic permeability of a $(Co_{l-v}T_v)_xX_yO_zX_w$ system magnetic thin film layer used in a magneto-impedance effect element of the present invention.

FIG. 8 is a graph showing the relation between frequency and magnetic permeability of a $(Co_{l-v}T_v)_x M_y O_z X_w$ system magnetic thin film layer used in the magneto-impedance effect element of the present invention. As the magnetic thin film layer 2 having the magneto-impedance effect, another material having soft magnetic properties can be used, which is represented by the composition formula $(Co_{l-v}T_v)_x M_y O_z X_w$ wherein T is at least one of the elements Fe and Ni, M is at least one element selected from the group consisting of Ti, Zr, Hf, Ta, Cr, Mo, Si, P, C, W, B, Al, Ga, Ge and the rare earth elements, X is at least one element selected from the group consisting of Au, Ag, Cu, Ru, Rh, Os, Ir, Pt, and Pd, the composition ratio v satisfies the relation $0 \leq v \leq 0.7$, and x, y, z and w by at % satisfy the relations $3 \leq y \leq 30$, $7 \leq z \leq 40$, $0 \leq w \leq 20$, and $20 \leq y+z+w \leq 60$, the balance composed of x. In this composition, the magnetic thin film layer 2 represented by $(Co_{l-v}T_v)_x M_y O_z X_w$ comprises a mixture of an amorphous phase containing a large amount of oxide of element M, and a fine-crystal phase mainly composed of Co and element T having at least one of bcc, hcp and fcc structures, the fine-crystal phase having a crystal structure containing an oxide of element M.

First, the $(Co_{l-v}T_v)_x M_y O_z X_w$ system magnetic thin film layer 2 was formed, and resistivity ρ, effective magnetic permeability μ', and magnetic permeability μ" of the imaginary part were determined. The magnetic thin film layer 2 was deposited on the substrate 1 made of glass, which was indirectly cooled with water, by sputtering using a radio frequency bipolar sputtering apparatus with an input power of 200 W and a composite target comprising a Co target and pellets of each element arranged on the Co target under an Ar+$O_2$ gas pressure of $5 \times 10^{-3}$ Torr in an atmosphere containing Ar and 0.1 to 2.0% of $O_2$.

It is found that $(Co_{l-v}T_v)_xM_yO_zX_w$ system magnetic thin film layer 2 has a high resistivity p of about 1200 ($\mu\Omega \cdot cm$), and high magnetic permeability even in the high frequency region. The relation of the magnetic permeability of the $(Co_{l-v}T_v)_xM_yO_zX_w$ system magnetic thin film layer 2 to frequency is described with reference to $Co_{44.3}Fe_{19.1}Hf_{14.5}O_{22.1}$ as an example shown in FIG. 8. The effective magnetic permeability $\mu'$ is substantially constant at a high value up to the GHz frequency band, and the magnetic permeability $\mu''$ of the imaginary part is kept down. The so-called quality factor Q represented by (effective magnetic permeability $\mu'$)/(magnetic permeability $\mu''$ of the imaginary part) is about 2 or more at a frequency of 1 GHz or less, and the quality factor can be ensured in the range of $Q \leq 1$ in which a loss can be kept down. The effective magnetic permeability $\mu'$ at 500 MHz, magnetic permeability $\mu''$ Git. of the imaginary part, and performance factor Q of other $(Co_{l-v}T_v)_xM_yO_zX_w$ system magnetic thin film layers 2 were determined. The results are shown in Table 2.

TABLE 2

| Film composition | $\mu'$ | $\mu''$ | Q |
|---|---|---|---|
| $(Co_{0.9}Fe_{0.1})_{67}Zr_{13}O_{20}$ | 250 | 120 | 2.08 |
| $(Co_{0.7}Fe_{0.3})_{60}Ti_{15}O_{25}$ | 110 | 40 | 2.75 |
| $(Co_{0.75}Fe_{0.25})_{62}Nb_{14}O_{24}$ | 70 | 40 | 1.75 |
| $(Co_{0.71}Fe_{0.29})_{66}Ta_{13}O_{21}$ | 60 | 40 | 1.50 |
| $(Co_{0.8}Fe_{0.2})_{60}Mo_{15}O_{25}$ | 70 | 30 | 2.33 |
| $(Co_{0.73}Fe_{0.27})_{58}W_{16}O_{26}$ | 70 | 30 | 2.33 |
| $(Co_{0.68}Fe_{0.32})_{60}Hf_{15}O_{19}N_6$ | 90 | 20 | 4.50 |
| $(Co_{0.72}Fe_{0.28})_{59}Hf_{15}O_{20}C_5$ | 310 | 180 | 1.72 |
| $(Co_{0.72}Fe_{0.28})_{59}Hf_{15}O_{19}B_7$ | 100 | 30 | 3.33 |
| $(Co_{0.67}Fe_{0.33})_{57}Hf_{17}O_{26}$ | 70 | 30 | 2.33 |
| $(Co_{0.85}Fe_{0.15})_{59}Hf_{16}O_{25}$ | 100 | 30 | 3.33 |
| $(Co_{0.8}Fe_{0.2})_{57}Hf_{16}O_{27}$ | 60 | 10 | 6.00 |
| $(Co_{0.7}Fe_{0.3})_{58}Hf_{14}O_{25}Cr_3$ | 110 | 20 | 5.50 |
| $(Co_{0.7}Fe_{0.3})_{61}Hf_{16}O_{20}Al_3$ | 130 | 20 | 6.50 |

Table 2 indicates that $(Co_{l-v}T_v)_xM_yO_zX_w$ system magnetic thin film layers 2 have high effective magnetic permeability $\mu'$ in the high frequency region of 500 MHz, and a performance factor Q of 1 or more, and are thus excellent soft magnetic materials causing less loss. It is also found that the soft magnetic properties deteriorate beyond the above composition range. Such excellent soft magnetic materials exhibit the good magneto-impedance effect, and can thus be applied to the magnetic thin film layer 2 used in a magneto-impedance effect element.

Example 4

Figure 9A:
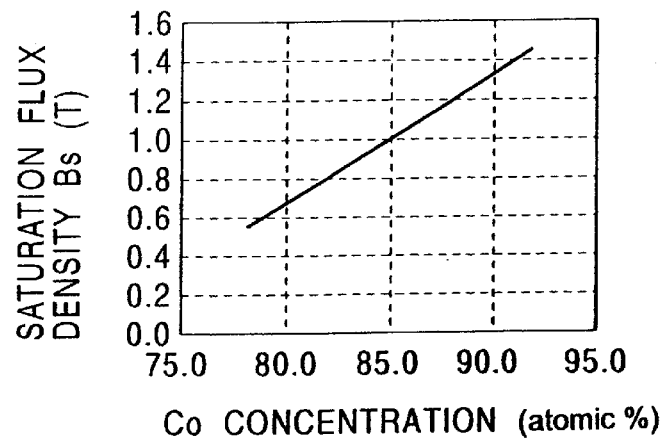
FIGS. 9A–9C are a graph showing magnetic characteristics of a $Co_aZr_bNb_c$ system magnetic thin film layer used in a magneto-impedance effect element of the present invention.
Figure 9B:
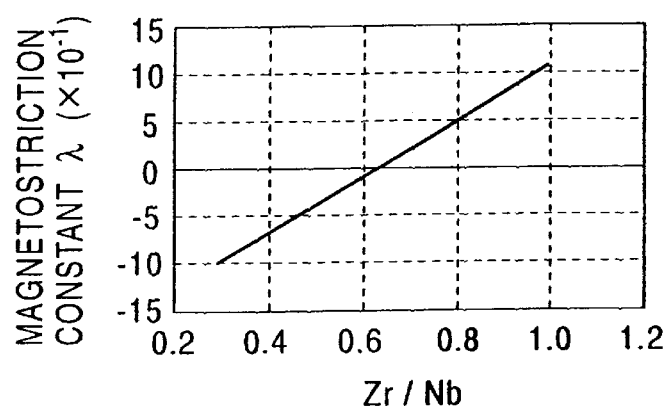
Figure 9C:
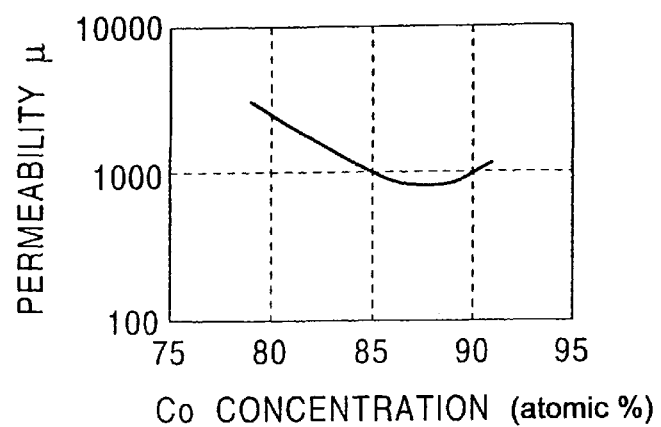
Figure 10:
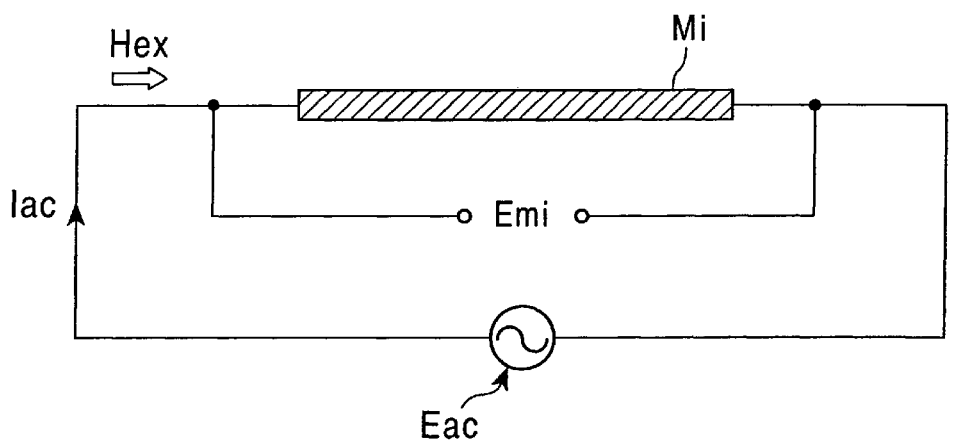
FIG. 10 is a drawing showing a circuit for measuring magneto-impedance characteristics of a conventional magneto-impedance effect element.
Figure 11:
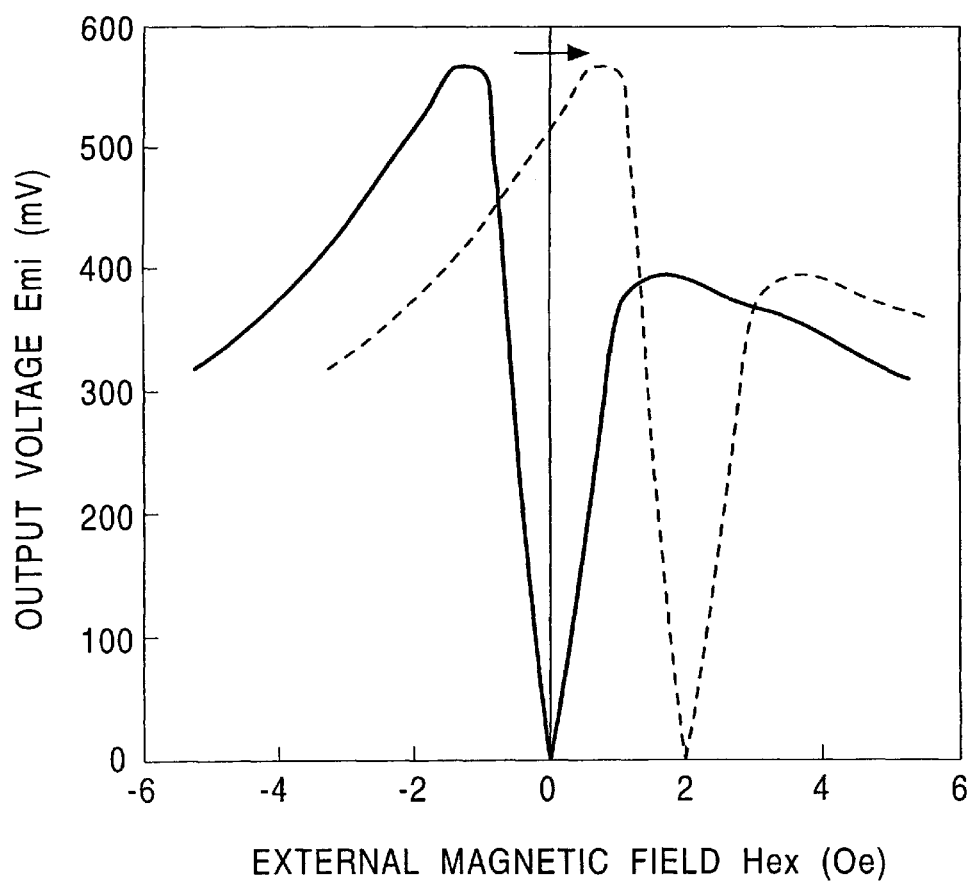
FIG. 11 is a graph showing magneto-impedance characteristics of a conventional $(Fe_6Co_{94})_{72.5}Si_{12.5}B_{15}$ amorphous wire having a magneto-impedance effect.
Figure 12:
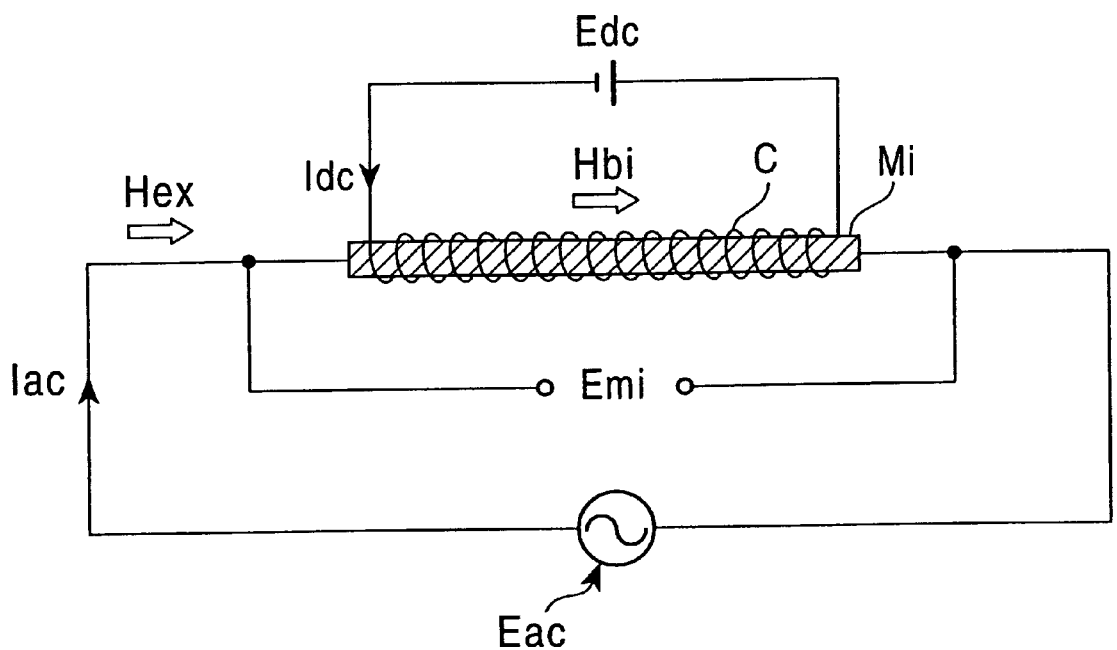
FIG. 12 is a drawing showing another circuit for measuring magneto-impedance characteristics of a conventional magneto-impedance effect element.

FIG. 9 is a graph showing the magnetic properties of a $Co_aZr_bNb_c$ system magnetic thin film layer used in the magneto-impedance effect element of the present invention. FIG. 9A is a graph showing the relation between the Co content (at %) and saturation magnetic flux density Bs, FIG. 9B is a graph showing the relation between Zr/Nb and magnetostriction constant $\lambda$, and FIG. 9C a graph showing the relation between the Co content (at %) and magnetic permeability $\mu$ at 10 MHz. As the magnetic thin film layer 2 having the magneto-impedance effect, another material exhibiting soft magnetic properties can be used, which is represented by the composition formula $Co_aZr_bNb_c$ wherein a, b and c by at % satisfy the relations $78 \leq a \leq 91$, $b = (0.5 \sim 0.8) \times (100-a)$, and $c = 100-a-b$, and which is mainly composed of an amorphous single phase or an amorphous phase.

The $Co_aZr_bNb_c$ system magnetic thin film layer 2 was formed, and saturation magnetic flux density Bs, magnetostriction constant $\lambda$, resistivity $\rho$, and magnetic permeability $\mu$ were determined. The magnetic thin film layer 2 was deposited by sputtering in a magnetic field and in an Ar atmosphere using a RF conventional sputtering apparatus and a composite target comprising a Co target and pellets of each of Zr and Nb arranged on the Co target.

FIG. 9A indicates that the saturation magnetic flux density Bs depends upon the Co concentration, and that the saturation magnetic flux density Bs is as high as 0.6 to 1.4 (T) at a Co concentration of 78 to 91 at %. A Co concentration of over 91 at % is undesirable because corrosion resistance deteriorates, and crystallization is started with difficulties in forming an amorphous phase. A Co concentration of less than 78 at % is also undesirable because the ratio of Co elements in contact with each other is decreased, thereby causing difficulties in obtaining soft magnetic properties.

FIG. 9B indicates that the magnetostriction constant $\lambda$ changes linearly with Zr/Nb, and that in order to obtain the relation, magnetostriction constant $\lambda \leq 0.5 \times 10^{-6}$, which is a measure for excellent soft magnetic materials, it is necessary that $0.5 \leq Zr/Nb \leq 0.8$. Namely, the composition ratio b (at %) of Zr is $b = (0.5 \sim 0.8) \times (100-a-c)$, and the composition ratio c (at %) of Nb is the balance (100-a -b).

FIG. 9C indicates that magnetic permeability $\mu$ at 10 MHz is as high as 900 or more at any Co concentration in the range of 78 to 91 at %. Therefore, since the $Co_aZr_bNb_c$ system magnetic thin film layer 2 is an excellent soft magnetic material, and exhibits the good magneto-impedance effect, the magnetic thin film layer 2 can be applied to the magnetic thin film layer 2 used in a magneto-impedance effect element.

Example 5

As the magnetic thin film layer 2 having the magneto-impedance effect, another material exhibiting soft magnetic properties can be used, which is composed of crystal grains of at least one of bcc structure Fe, bcc structure FeCo and fcc structure Co having an average grain size of 30 nm or less, or a mixture thereof at a ratio of 50% or more of the whole structure, and which is represented by the formula $T_{100-d-e-f-g}X_dM_eZ_fQ_g$ wherein T is at least one of the elements Fe and Co, X is at least one of the elements Si and Al, M is at least one element selected from the group consisting of Ti, Zr, Hf, V, Nb, Ta, Mo and W, Z is at least one of the elements C and N, Q is at least one element selected from the group consisting of Cr, Re, Ru, Rh, Ni, Pd, Pt, and Au, and d, e, f and g by at % satisfy the relations $0 \leq d \leq 25$, $1 \leq e \leq 10$, $0.5 \leq f \leq 15$, and $0 \leq g \leq 10$, respectively.

Another material exhibiting soft magnetic properties can also be used, which is composed of crystal grains of at least one of bcc structure Fe, bcc structure FeCo and fcc structure Co having an average grain size of 30 nm or less, or a mixture thereof at a ratio of 50% or more of the whole structure, and which is represented by the composition Formula $T_{100-p-q-f-g}Si_pAl_qM_eZ_fQ_g$ wherein T is at lest one of the elements Fe and Co, M is at least one element selected from the group consisting of Ti, Zr, Hf, V, Nb, Ta, Mo and W, Z is at least one of the elements C and N, Q is at least one element selected from the group consisting of Cr, Re, Ru, Rh, Ni, Pd, Pt, and Au, and p, q, e, f and g by at % satisfy the relations $8 \leq p \leq 15$, $0 \leq q \leq 10$, $1 \leq e \leq 10$, $0.5 \leq f \leq 15$, and $0 \leq g \leq 10$, respectively.

The $T_{100-d-e-f-g}X_dM_eZ_fQ_g$ system and $T_{100-p-q-f-g}Si_pAl_qM_eZ_fQ_g$ system magnetic thin film layers 2 were formed, and effective magnetic permeability $\mu'$, coercive force Hc, and magnetostriction constant $\lambda$ were determined. Each of the magnetic thin film layer 2 can be formed by sputtering or vapor deposition using a conventional sputtering apparatus such as a RF bipolar sputtering, DC sputtering, magnetron sputtering, triple-pole sputtering, ion beam sputtering, opposed target sputtering apparatus, or the like. Although the resultant magnetic thin film layer 2 is mainly composed of an amorphous phase, the magnetic thin film layer 2 is heated at 680° C. for 20 minutes so as to have a crystal structure composed of crystal grains having an average grain size of 30 nm or less, which mainly comprise crystal grains of a carbide or nitride of metal element M, and crystal grains of bcc structure Fe, bcc structure FeCo, or fcc structure Co. Each of the magnetic thin film layers 2 comprises at least 50% or more of crystal grains; the balance mainly composed of an amorphous phase. The results are shown in Table 3.

TABLE 3

| Film composition | $\mu$ (1 MHz) | Hc (Oe) | $\lambda$ |
|---|---|---|---|
| $Fe_{81.8}Si_{10.2}Hf_{3.0}C_{5.0}$ | 3800 | 0.20 | +1.0 |
| $Fe_{80.7}Si_{10.5}Zr_{3.3}C_{5.5}$ | 4000 | 0.21 | +0.8 |
| $Fe_{78.0}Si_{11.0}Nb_{5.0}C_{6.0}$ | 3200 | 0.19 | +0.7 |
| $Fe_{79.9}Si_{9.3}Ta_{4.8}C_{6.0}$ | 3100 | 0.18 | +1.6 |
| $Fe_{80.7}Al_{6.2}Hf_{5.0}C_{8.1}$ | 2500 | 0.18 | +2.1 |
| $Fe_{79.1}Al_{6.8}Zr_{5.3}C_{8.8}$ | 2300 | 0.20 | +2.5 |
| $Fe_{77.9}Al_{5.1}Nb_{8.0}C_{9.0}$ | 2000 | 0.20 | +2.0 |
| $Fe_{78.8}Al_{5.0}Ta_{7.9}C_{8.3}$ | 2200 | 0.17 | +1.9 |
| $Fe_{75.3}Si_{12.4}Al_{4.3}Hf_{3.0}C_{5.0}$ | 5100 | 0.15 | +0.8 |
| $Fe_{75.9}Si_{12.0}Al_{4.8}Zr_{2.8}C_{4.5}$ | 5000 | 0.13 | +1.0 |
| $Fe_{67.4}Si_{11.5}Al_{4.0}Nb_{8.1}C_{9.0}$ | 4500 | 0.15 | +0.9 |
| $Fe_{66.7}Si_{12.0}Al_{5.0}Ta_{7.8}C_{8.5}$ | 4300 | 0.20 | +1.2 |
| $Fe_{72.0}Si_{12.5}Al_{4.5}Hf_{3.0}C_{5.0}Cr_{3.0}$ | 3800 | 0.20 | +1.7 |
| $Fe_{72.7}Si_{12.0}Al_{3.0}C_{4.8}Ti_{4.5}$ | 4100 | 0.25 | +1.3 |
| $Fe_{72.5}Si_{12.1}Al_{3.8}Hf_{2.8}C_{4.0}Mo_{4.8}$ | 4000 | 0.29 | +1.2 |
| $Fe_{72.5}Si_{11.9}Al_{4.0}Hf_{2.9}C_{4.1}W_{4.6}$ | 4300 | 0.30 | +1.3 |
| $Fe_{73.0}Si_{11.0}Al_{4.1}Hf_{3.0}C_{4.0}V_{4.9}$ | 3900 | 0.31 | +1.0 |
| $Fe_{73.1}Si_{12.7}Al_{3.7}Hf_{2.5}C_{3.9}Re_{4.1}$ | 2200 | 0.21 | +2.0 |
| $Fe_{75.7}Si_{12.6}Al_{3.8}Hf_{2.3}C_{3.5}Rh_{2.1}$ | 3000 | 0.18 | +1.4 |
| $Fe_{73.7}Si_{12.0}Al_{4.0}Hf_{2.2}C_{3.4}Ni_{4.7}$ | 1800 | 0.11 | +2.5 |
| $Fe_{71.2}Si_{12.2}Al_{4.0}Hf_{3.0}C_{4.8}Co_{4.8}$ | 1500 | 0.10 | +2.7 |
| $Fe_{73.6}Si_{12.0}Al_{3.8}Hf_{2.7}C_{3.9}Pd_{4.0}$ | 4000 | 0.13 | +1.5 |
| $Fe_{74.8}Si_{12.1}Al_{3.8}Hf_{2.3}C_{5.0}Pt_{2.0}$ | 4300 | 0.11 | +1.2 |
| $Fe_{74.5}Si_{12.1}Al_{3.9}Hf_{2.4}C_{4.8}Au_{2.3}$ | 4800 | 0.10 | +1.1 |
| $Fe_{72.6}Si_{12.4}Al_{4.0}Hf_{2.3}C_{4.7}Ru_{4.0}$ | 2300 | 0.20 | +1.9 |

Table 3 indicates that in the above composition range, the $T_{100-d-e-f-g}X_dM_eZ_fQ_g$ system and $T_{100-p-q-f-g}Si_pAl_qM_eZ_fQ_g$ system magnetic thin film layers 2 have magnetic permeability of as high as 1500 to 5100 even at 1 MHz, low coercive force Hc, and a low magnetostriction constant $\lambda$ of the $10^{-6}$ order. It is thus found that the $T_{100-d-e-f-g}X_dM_eZ_fQ_g$ system magnetic thin film layer 2 can be desirably applied to a magneto-impedance effect element, and is an excellent soft magnetic material.

What is claimed is:

1. A magneto-impedance effect element comprising a magnetic thin film layer having a magneto-impedance effect, and bias magnetic field applying means comprising a thin film for applying a bias magnetic field to the magnetic thin film layer in parallel with the direction of application of an external magnetic field to the magnetic thin film layer, wherein the magnetic thin film layer comprises a soft magnetic thin film mainly composed of an amorphous phase, and represented by the composition formula $Co_lTa_mHf_n$ wherein l, m and n by atomic % satisfy the relations $70 \leq l \leq 90$, $5 \leq m \leq 21$, $6.6 \leq n \leq 15$, and $1 \leq m/n \leq 2.5$, respectively.

2. A magneto-impedance effect element comprising a magnetic thin film layer having a magneto-impedance effect, and bias magnetic field applying means comprising a thin film for applying a bias magnetic field to the magnetic thin film layer in parallel with the direction of application of an external magnetic field to the magnetic thin film layer, wherein the magnetic thin film layer comprises a soft magnetic thin film which is composed of an amorphous phase at a ratio of 50% or more of the whole structure, and the balance composed of bcc-structure Fe crystal grains having an average grain size of 30 nm or less, and which is represented by the composition formula $Fe_hR_iO_j$ wherein R is at least one element selected from the rare earth elements, and the group consisting of Ti, Zr, Hf, V, Nb, Ta, and W, and h, i, and j by atomic % satisfy the relations $45 \leq h \leq 70$, $5 \leq i \leq 30$, $10 \leq j \leq 40$, and $h+i+j=100$.

3. A magneto-impedance effect element comprising a magnetic thin film layer having a magneto-impedance effect, and bias magnetic field applying means comprising a thin film for applying a bias magnetic field to the magnetic thin film layer in parallel with the direction of application of an external magnetic field to the magnetic thin film layer, wherein the magnetic thin film element layer comprises a soft magnetic thin film which is composed of an amorphous phase containing a large amount of oxide of element M, and crystal grains having at least one of bcc, hcp and fcc structures mainly composed of Co and element T, and which is represented by the composition formula $Co_{l-v}T_v)_xM_yO_zX_w$, wherein T is at least one of the elements Fe and Ni, M is at least one element selected from the group consisting of Ti, Zr, Hf, Ta, Cr, Mo, Si, P, C, W, B, Al, Ga, Ge and the rare earth elements, X is at least one element selected from the group consisting of Au, Ag, Cu, Ru, Rh, Os, Ir, Pt, and Pd, the composition ratio v satisfies the relation $0 \leq v \leq 0.7$, and x, y, z and w by atomic % satisfy the relations $3 \leq y \leq 30$, $7 \leq z \leq 40$, $0 \leq w \leq 20$, and $20 \leq y+z+w \leq 60$, the balance composed of x.

4. A magneto-impedance effect element comprising a magnetic thin film layer having a magneto-impedance effect, and bias magnetic field applying means comprising a thin film for applying a bias magnetic field to the magnetic thin film layer in parallel with the direction of application of an external magnetic field to the magnetic thin film layer, wherein the magnetic thin film layer comprises a soft magnetic thin film which is mainly composed of an amorphous phase, and which is represented by the composition formula $Co_aZr_bNb_c$ wherein a, b and c by atomic % satisfy the relations $78 \leq a \leq 91$, $b=(0.5-0.8)\times(100-a-c)$, and $c=100-a-b$.

5. A magneto-impedance effect element comprising a magnetic thin film layer having a magneto-impedance effect, and bias magnetic field applying means comprising a thin film for applying a bias magnetic field to the magnetic thin film layer in parallel with the direction of application of an external magnetic field to the magnetic thin film layer, wherein the magnetic thin film layer comprises a soft magnetic thin film which is composed of crystal grains of at least one of bcc structure Fe, bcc structure FeCo and fcc structure Co having an average grain size of 30 nm or less, or a mixture thereof at a ratio of 50% or more of the whole structure, and which is represented by the composition formula $T_{100-d-e-f-g}X_dM_eZ_fQ_g$ wherein T is at least one of the elements Fe and Co, X is at least one of the elements Si and Al, M is at least one element selected from the group consisting of Ti, Zr, Hf, V, Nb, Ta, Mo and W, Z is at least one of the elements C and N, Q is at least one element selected from the group consisting of Cr, Re, Ru, Rh, Ni, Pd, Pt, and Au, and d, e, f and g by atomic % satisfy the relations $0 \leq d \leq 25$, $1 \leq e \leq 10$, $0.5 \leq f \leq 15$, and $0 \leq g \leq 10$, respectively.

6. A magneto-impedance effect element comprising a magnetic thin film layer having a magneto-impedance effect, and bias magnetic field applying means comprising a thin film for applying a bias magnetic field to the magnetic thin film layer in parallel with the direction of application of an external magnetic field to the magnetic thin film layer, wherein the magnetic thin film layer comprises a soft magnetic thin film which is composed of crystal grains of at least one of bcc structure Fe, bcc structure FeCo and fcc structure Co having an average grain size of 30 nm or less, or a mixture thereof at a ratio of 50% or more of the whole structure, and which is represented by the composition formula $T_{100-p-q-f-g}Si_pAl_qM_eZ_fQ_g$ wherein T is at least one of the elements Fe and Co, M is at least one element selected from the group consisting of Ti, Zr, Hf, V, Nb, Ta, Mo and W, Z is at least one of the elements C and N, Q is at least one element selected from the group consisting of Cr, Re, Ru, Rh, Ni, Pd, Pt, and Au, and p, q, e, f and g by atomic % satisfy the relations $8 \leq p \leq 15$, $0 \leq q \leq 10$, $1 \leq e \leq 10$, $0.5 \leq f \leq 15$, and $0 \leq g \leq 10$, respectively.

* * * * *

UNITED STATES PATENT AND TRADEMARK OFFICE
CERTIFICATE OF CORRECTION

PATENT NO. : 6,239,594 B1
DATED : May 29, 2001
INVENTOR(S) : Yutaka Naito et al.

Page 1 of 1

It is certified that error appears in the above-identified patent and that said Letters Patent is hereby corrected as shown below:

Title page, Item [54], and Column 1, line 1,
Title, change "MAGETO-IMPEDANCE" to -- MAGNETO-IMPEDANCE --.

Claim 1,
Line 11, change "$\leqq$" to -- $\leq$ -- in all instances.

Claim 2,
Lines 15-16, change "$\leqq$" to -- $\leq$ -- in all instances.

Claim 3,
Line 12, insert -- ( -- after "formula".
Lines 19-20, change "$\leqq$" to -- $\leq$ -- in all instances.

Claim 4,
Line 11, change "$\leqq$" to -- $\leq$ -- in all instances.

Claim 5,
Line 20, change "$\leqq$" to -- $\leq$ -- in all instances.

Claim 6,
Lines 19-20, change "$\leqq$" to -- $\leq$ -- in all instances.

Signed and Sealed this

Twelfth Day of March, 2002

*Attest:*

JAMES E. ROGAN
*Attesting Officer*     *Director of the United States Patent and Trademark Office*